United States Patent [19]

Kashiwagi et al.

[11] Patent Number: 5,218,400
[45] Date of Patent: Jun. 8, 1993

[54] DEVELOPING APPARATUS OF PHOTORESIST

[75] Inventors: Toshiyuki Kashiwagi, Tokyo; Kohtaroh Kurokawa, Kanagawa, both of Japan

[73] Assignee: Sony Corporation, Tokyo, Japan

[21] Appl. No.: 848,649

[22] Filed: Mar. 9, 1992

[30] Foreign Application Priority Data

Mar. 7, 1991 [JP] Japan .................................. 3-041810

[51] Int. Cl.⁵ .................... G03B 27/32; G03B 27/52; G03B 27/42
[52] U.S. Cl. .......................................... 355/27; 355/53
[58] Field of Search ...................... 250/560; 354/298; 355/27, 53, 54

[56] References Cited

U.S. PATENT DOCUMENTS

| | | | |
|---|---|---|---|
| 4,647,172 | 3/1987 | Batchelder et al. | 354/298 |
| 4,841,342 | 6/1989 | Suzuki et al. | 355/53 X |
| 4,899,195 | 2/1990 | Gotoh | 355/53 X |
| 4,910,549 | 3/1990 | Sugita | 355/53 |
| 4,998,021 | 3/1991 | Mimasaka | 250/560 |
| 5,028,955 | 7/1991 | Hayashida et al. | 355/53 |
| 5,119,127 | 6/1992 | Watanuki | 355/53 |

FOREIGN PATENT DOCUMENTS 2108710 5/1983 United Kingdom .

OTHER PUBLICATIONS

*Patent Abstracts of Japan,* vol. 12, No. 395 (E-671) Oct. 20, 1988 of Japanese Application 63136625 of Jun. 8, 1988.
*Patent Abstracts of Japan,* vol. 10, No. 256, (P-493) Sep. 2, 1986 of Japanese Application 61083904 of Apr. 28, 1986.
*Patent Abstracts of Japan,* vol. 14, No. 372, (P-1091) Aug. 10, 1990 of Japanese Application 2137852 of May 28, 1990.
Mariste Thomson, "In Situ End Point Control of Photoresist Development", *Solid State Technology,* vol. 33, No. 5, May 1990, pp. 171-175.

*Primary Examiner*—Richard A. Wintercorn
*Attorney, Agent, or Firm*—Hill, Steadman & Simpson

[57] ABSTRACT

A developing apparatus of photoresist for controlling development of a photoresist formed on a light-transmitting substrate and having a latent image produced by exposure thereof to an irradiation for equi-pitch patterns, adapted to detect monitor light diffracted by the equi-pitch patterns produced as development of the resist advances after the diffracted light is totally reflected at the opposite surface to the surface through which it is let in and diffracted again by the equi-pitch patterns and the developing process is controlled according to a signal obtained as the result of the detection.

1 Claim, 2 Drawing Sheets

DEVELOPING APPARATUS OF PHOTORESIST

BACKGROUND OF THE INVENTION

1. Field of the Invention

The present invention relates to a developing apparatus of photoresist suitable for use in fabrication of optical disks.

2. Description of the Related Art

In an optical disk, grooves are formed on both sides of its recording track and convex and concave pits are formed as information recorded thereon.

In fabricating such optical disk, a photoresist is applied to the surface of a glass substrate, for example, and the photoresist is exposed to pattern irradiation and then developed, and, thereby, convex and concave photoresist patterns corresponding to the grooves or pits are formed. Then, such a process as plating is performed on such convex and concave surface or on a convex and concave surface obtained by etching the surface of the substrate with the photoresist used as a mask and, thereby, a master for example of a stamper for forming the optical disk is fabricated.

In order to fabricate such photoresist patterns accurately, it is required in performing development of the photoresist after its exposure to irradiation to set up the developing time properly taking such conditions as temperature of the developing solution into consideration, so that neither over-development nor under-development is made and, thereby, desired patterns, i.e., grooves for the track or information pits being accurate in width, depth, and so on are formed.

Since the grooves in an optical disk or the like are arranged at an equal pitch in the radial direction of the optical disk and the information pits are also arranged substantially at an equal pitch in the radial direction under the condition of the substrate being rotated, equi-pitch windows are produced in the photoresist as development advances in the course of development of a latent image produced in the photoresist by its exposure to an irradiation corresponding to the pattern of grooves or the pattern of information pits. Making use of such equi-pitch windows as a diffraction grating, there is a method for controlling the development to be performed neither excessively nor deficiently, in which monitor light with a long wavelength to which the photoresist is not photosensitive is irradiated on such diffraction grating and the developing process is stopped according to results of detection of the light diffracted thereby.

The relative principle will be described with reference to FIG. 3. In this case, a photoresist layer 2 applied to the surface of a light transmitting substrate 1 such as a glass substrate is exposed to an irradiation having a required pattern for example of grooves or information pits.

Then, the photoresist layer 2 exposed to the pattern irradiation and having a latent image produced by the exposure is normally developed, for example by being subjected to a spray of a developing solution. In the course of the development, for example, monitor light $L_M$ is irradiated on the side where the photoresist layer 2 is formed, and the light of first-order diffracted light $L_{M1}$, for example, produced by the equi-pitch patterns formed as the development of the photoresist layer 2 advances and serving as a diffraction grating, led out from the opposite side of the substrate 1 is detected by a photodetector 3 such as a photodiode. The monitor light $L_M$ is set to have a predetermined wavelength $\lambda$ and it is adapted such that, when desired equi-pitch patterns are formed, the output of the photodetector 3 reaches a predetermined value, and the developing process on the photoresist layer 2 is stopped by this detection signal, and thereby the development is performed neither excessively nor deficiently to provide developed patterns with a predetermined width and hence predetermined distance and depth.

In this case, as the monitor light $L_M$, coherent light with a long wavelength not exposing the photoresist is used.

However, as the track pitch, for example, becomes smaller to meet the demand for higher recording density, the pitch of grooves or radial spacing between pit trains of the disk becomes smaller, that is, the pitch P of the photoresists on the optical disk shown in its section in the radial direction of FIG. 3, for example, becomes smaller. Then, there arises a problem that the diffracted light of the monitor light entering the light transmitting substrate 1 is not let out of the surface on the opposite side of the substrate toward the optical detector element but totally internally reflected at the surface.

Now, denoting, as shown in FIG. 3, the refractive index of the substrate 1 by n, the refractive index of the external media, for example the air, by $n_0$, the angle of diffraction of the monitor light with a wavelength of $\lambda$ by $\theta_1$, and the angle of emission by $\theta_2$, a relationship given by the following expression (1) is obtained as to the angle of first-order diffraction $\theta_1$ within the light transmitting substrate 1, i.e., the glass substrate 1, $$\sin\theta_1 = n_0\lambda/nP. \quad (1)$$

The relationship between the angle of diffraction $\theta_1$ and the angle of emission $\theta_2$ is expressed as $$n\sin\theta_1 = n_0\sin\theta_2. \quad (2)$$

Assuming now that $n_0 = 1$, and substituting the condition for the diffracted light to be totally reflected internally at the surface of the substrate 1, i.e., $\theta_2 \geq \pi/2$, for the above expressions (1) and (2), we obtain $P = \lambda$. That is, when the pitch P of the patterns becomes smaller than the wavelength $\lambda$ of the monitor light $L_M$, the monitoring according to the method of FIG. 3 becomes impossible.

SUMMARY OF THE INVENTION

Accordingly, an object of the present invention is to make it possible, even when a photoresist having equi-pitch patterns arranged at a narrow pitch is to be formed, to positively detect the desired equi-pitch patterns produced in the photoresist layer and control the developing condition of the photoresist according to the results of the detection.

According to the present invention, as shown in FIG. 1 of a schematic structural diagram of an example of the invention, there is provided a developing apparatus of photoresist having a developing means 4 of photoresist performing a developing process on a photoresist layer 2 formed on a light transmitting substrate 1, which has a latent image produced by its exposure to an irradiation for equi-pitch patterns, a light source 5 of monitor light $L_M$ having a predetermined wavelength $\lambda$, which is such a long wavelength that the photoresist layer 2 does not exhibit photosensitivity thereto, and a photodetector 3 for detecting diffracted light by the patterns produced as the development of the photoresist 2 advances, and being adapted to control the developing means 4 according to the detected output thereby, in which, the distance $l_S$ between the optical axis of the light source 5 of monitor light and the optical axis of the photodetector 3, when the equal pitch is made narrow and the relationship between the pitch P and the wavelength $\lambda$ is expressed as $P \leq \lambda$, is selected to be given by the following expression (3), where the thickness of the substrate 1 is represented by d and the refractive index of the substrate 1 is represented by n, $$l_S = 2d\tan\{\sin^{-1}(\lambda/nP)\} \cdot m \quad \text{(m: integer other than 0),} \quad (3)$$

Further, it is adapted such that the monitor light diffracted by equi-pitch patterns formed in the photoresist layer 2 through the development of the photoresist layer 2 performed by the developing means 4 is detected by the photodetector 3 after it is totally reflected at the surface opposite to the surface through which the monitor light $L_M$ was let in and diffracted again by the equi-pitch patterns.

Control of the developing means 4, such as stoppage of the developing process, is executed according to the detected output by the photodetector 3.

In the above described arrangement of the present invention, as indicated in its optical path drawing of FIG. 2, under the condition $P \leq \lambda$, the monitor light $L_M$ with the long wavelength from the light source 5 is introduced into the light transmitting substrate 1 for example in the direction perpendicular to the surface 1a of the substrate 1 having the photoresist layer 2 formed thereon. Then, as the etching of the photoresist layer 2 is advanced and the equi-pitch patterns, i.e., a diffraction grating, appear therein, the first-order diffracted light thereby is totally reflected at the surface 1b of the substrate 1 opposite to the surface 1a where the photoresist layer 2 is formed and the reflected light progresses again to the equi-pitch patterns formed in the photoresist layer 2 and the re-diffracted light thereby is led to the outside for example from the side of the surface 1a parallel to the incident monitor light $L_M$. By previously arranging the distance $l_s$ between the photodetector 3 and the light source 5 to satisfy the above expression (3), the light let out is detected by the photodetector 3 as detected light LD, and when the output from the photodetector 3 reaches a predetermined value, the developing process by the developing means 4 is stopped. Thereby, the developing process of the photoresist layer 2 can be stopped when the pattern in the photoresist layer 2 is set up to the desired pitch P.

In other words, the photoresist layer 2 having a predetermined pitch P can be obtained for sure.

DESCRIPTION OF THE PREFERRED EMBODIMENTS

Figure 1:
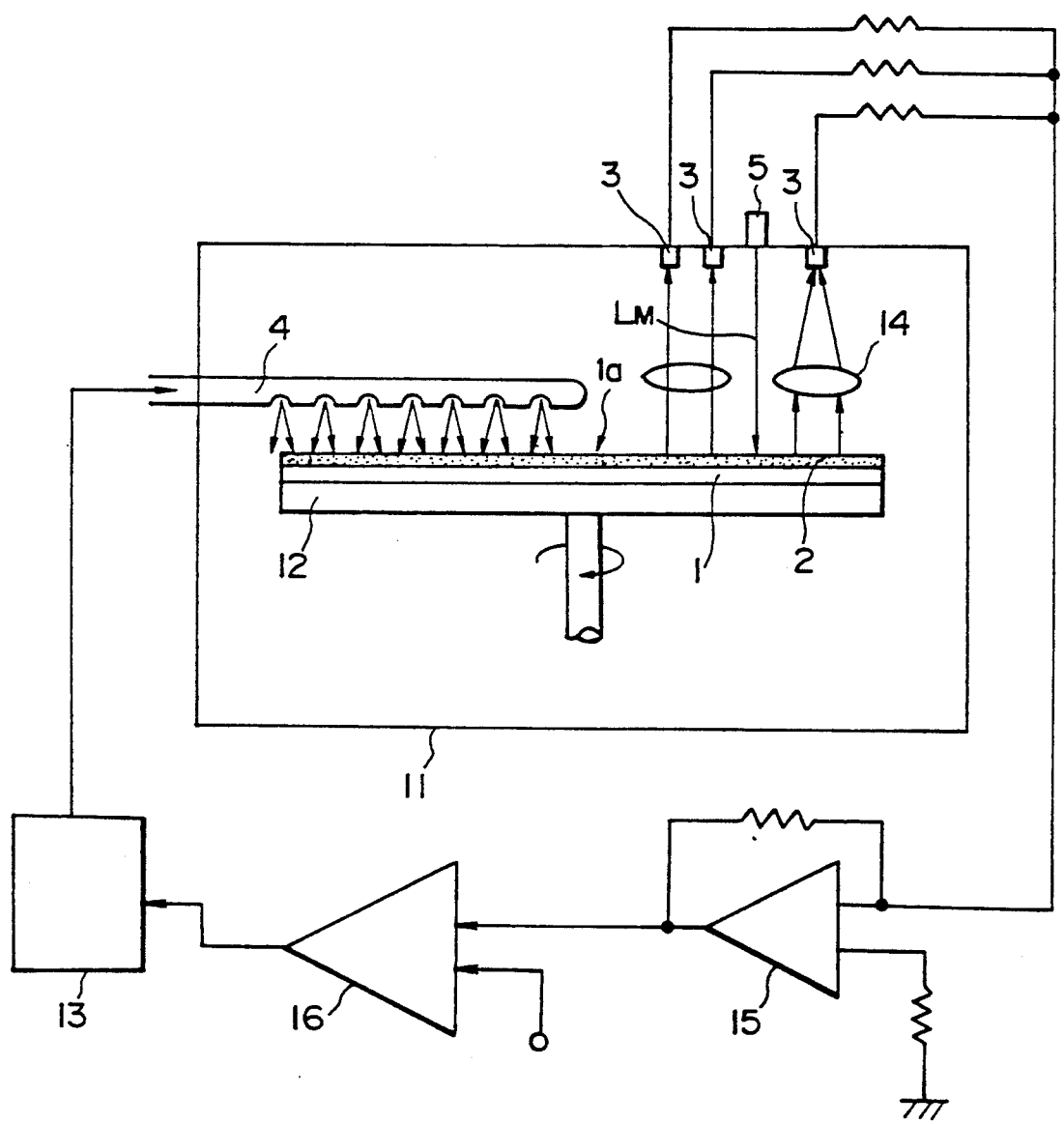
FIG. 1 is a structural drawing of an example of developing apparatus of photoresist according to the present invention.

An embodiment of a developing apparatus of an embodiment of the present invention will be described below with reference to FIG. 1. In this case, there is disposed a rotating table 12 within a developing chamber 11 and a light transmitting substrate 1 such as a glass substrate with a photoresist layer 2 deposited thereon is mounted on the table.

In confrontation with the light transmitting substrate 1 is disposed a developing means 4, which is adapted to blow out a developing solution to the photoresist layer 2 in the above described state through a plurality of nozzles.

Reference numeral 13 denotes a controller which controls starting and stopping of the developing process performed by the developing means 4.

Meanwhile, the photoresist layer 2 has a latent image previously produced by a predetermined pattern exposure, for example, a pattern exposure for forming inter-track grooves or record pits in a case for example of an optical disk. More specifically, the photoresist layer 2 is assumed to have a latent image obtained by undergoing a pattern exposure for grooves or record pits arranged at an equal pitch in the radial direction of the substrate 1 or substantially in its radial direction defined by its cooperation with the rotation of the rotating table 12.

Then, the photoresist layer 2 is irradiated by monitor light $L_M$ having such a long wavelength that the photoresist layer 2 exhibits no photosensitivity thereto, which light for example is a laser beam supplied from a light source 5.

Figure 2:
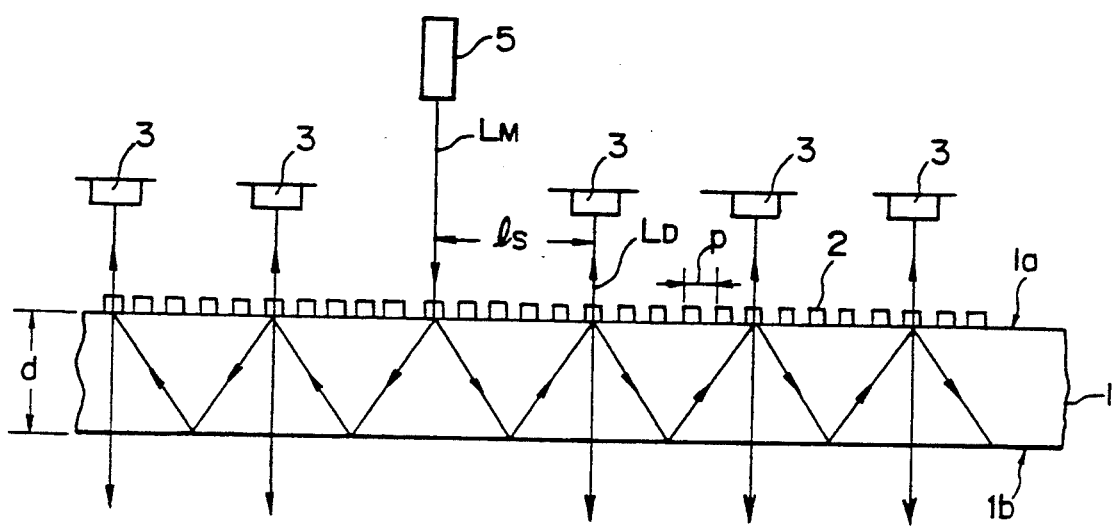
FIG. 2 is an explanatory drawing of the optical functioning of the present invention.
Figure 3:
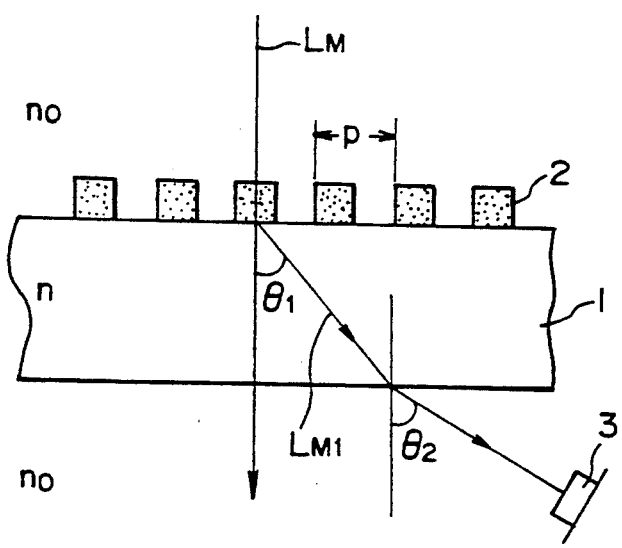
FIG. 3 is an explanatory drawing of a conventional apparatus.

On the other hand, as described in FIG. 2, a photodetector 3, for example a photodiode, is disposed at a position a predetermined distance $l_s$ according to the above mentioned expression (3) apart from the monitor light. There may be disposed a plurality of photodetectors 3.

Reference numeral 14 denotes a lens system formed of a condenser lens or the like arranged such that emitted light of the re-diffracted light from the surface 1a of the light transmitting substrate 1, through which the monitor light $L_M$ was let in, is effectively introduced into the photodetector 3.

Outputs from the photodetectors 3 are added up by an adder-amplifier 15 and the output therefrom is compared by a comparator circuit 16 with a voltage for comparison at a reference level preset therein, and a controller 13 is adapted to be controlled according to the result of the comparison. More specifically, when an input higher than the reference level is input to the comparator circuit 16, the controller 13 is controlled so that the supply of the developing solution from the developing means 4 is stopped.

In this way, the developing process can be stopped when the photoresist layer 2 is developed to such a degree that predetermined equi-pitch patterns are obtained, and it is thereby ensured that proper development, neither excessive nor deficient, of the photoresist layer 2 can be achieved even if there are changes in relative conditions such as the temperature of the developing solution.

As the result, patterns in the photoresist layer 2 at a predetermined pitch, i.e., those having a desired spacing and width, can be formed.

For example, as apparent from the expression (3), the distance $l_s$ is set to $l_s \approx 18$ mm when d=5 mm, $\lambda$=0.633 µm, n=1.5, and P=0.5 µm.

In the above described example in FIG. 1, the photodetector 3 is disposed on the side of the surface 1a through which the monitor light $L_M$ is let in. However, as understood by reference to FIG. 2, the re-diffracted light of the totally reflected light can also be led out to the side of the surface 1b opposite to the surface 1a on the side where the light source 5 is disposed, and therefore, the light source 5 and the photodetector 3 can be disposed on the opposite sides of the substrate 1. For example, by using a rotating table 12 which is made transparent to the light from the light source 5, such an arrangement can be made in which the light source 5 is disposed on the side of the surface 1b. Thus, not limited to the example illustrated, various other changes and modifications can be made.

As described in the foregoing, while equi-pitch patterns which are produced as etching of a photoresist advances are used as a diffraction grating, it is arranged in the present invention such that the totally-reflected light diffracted again by the equi-pitch patterns of the photoresist is used in detecting the monitor light in the case where the pitch is sufficiently reduced. Therefore, the pattern produced in the photoresist can be positively detected and control to achieve proper development, neither excessive nor deficient, can be executed.

Accordingly, by applying the present invention to pattern formation of the photoresist used for forming grooves for the track or record pits of an optical disk, for example, it is assured that a desired high-density track can be obtained with good reproducibility.

What is claimed is:

1. A developing apparatus of photoresist having developing means of photoresist performing a developing process on a photoresist layer formed on a light transmitting substrate and having a latent image produced by exposure thereof to irradiation for equi-pitch patterns, a light source of monitor light having a predetermined wavelength $\lambda$, which is such a long wavelength that the photoresist layer does not exhibit its photosensitivity thereto, and a photodetector for detecting diffracted light by the patterns produced as the development of the photoresist advances, and being adapted to control said developing means 4 according to the detection output, wherein the distance $l_s$ between the optical axis of said light source of monitor light and the optical axis of said photodetector, when the equal pitch is made narrower and the relationship between the pitch P and the wavelength $\lambda$ comes to be expressed as $P \leq \lambda$, is selected to be given by the following expression, where the thickness of said light-transmitting substrate 1 is represented by d and the refractive index of said light-transmitting substrate 1 is represented by n, $$l_s = 2d \tan \{\sin^{-1}(\lambda/nP)\} \cdot m,$$

(m: integer other than 0), and wherein it is adapted such that the monitor light diffracted by equi-pitch patterns formed in the photoresist layer through the development is detected by said photodetector after it is totally reflected at the surface opposite to the surface through which the monitor light was let in and diffracted again by the equi-pitch patterns and said developing means is controlled according to the results of the detection.

* * * * *